United States Patent
Popovich et al.

(12) 
(10) Patent No.: US 6,646,886 B1
(45) Date of Patent: Nov. 11, 2003

(54) POWER CONNECTION STRUCTURE

(75) Inventors: David A. Popovich, San Jose, CA (US); Robert Ballenger, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/121,206

(22) Filed: Apr. 12, 2002

(51) Int. Cl.[7] .......................... H05K 1/00; H05K 1/18; H05K 7/02; H05K 7/06; H05K 7/08

(52) U.S. Cl. ................. 361/748; 361/736; 361/792; 361/793; 361/794; 361/795; 361/760; 361/761; 174/255

(58) Field of Search .................. 361/760, 761, 361/748, 773, 774, 771, 772, 779, 736, 803, 792, 793, 794, 795; 174/255

(56) References Cited

U.S. PATENT DOCUMENTS

| | | | | |
|---|---|---|---|---|
| 3,566,005 A | * | 2/1971 | Shaheen | 174/262 |
| 3,660,726 A | * | 5/1972 | Ammon et al. | 174/262 |
| 5,363,280 A | * | 11/1994 | Chobot et al. | 361/794 |
| 5,381,306 A | * | 1/1995 | Schumacher et al. | 361/792 |
| 6,073,344 A | * | 6/2000 | Japp et al. | 29/830 |

* cited by examiner

*Primary Examiner*—David Martin
*Assistant Examiner*—Thanh Y. Tran
(74) *Attorney, Agent, or Firm*—Thelen Reid & Priest, LLP; Thierry Lo

(57) ABSTRACT

A multi-layer printed circuit board (PCB) has a plated through hole for receiving a pin of a component. The plated through hole passes through all layers of the PCB and includes a first conductive portion on a first surface of the PCB and a second conductive portion on a second surface of the PCB. At least one layer of the PCB includes a planar conductive material disposed over a planar insulating material. The conductive material surrounds the plated through hole and is separated therefrom by a gap.

30 Claims, 3 Drawing Sheets

POWER CONNECTION STRUCTURE

FIELD OF THE INVENTION

The present invention relates to printed circuit boards. More particularly, the present invention relates to a power connection structure for printed circuit boards.

BACKGROUND OF THE INVENTION

DC modules connected to printed circuit boards (PCB) have increasingly required higher current outputs. The connection from the PCB to the output pins can fail to provide an adequate path for the total current to transfer to the PCB without damaging it at the point of connection. Increasing the copper connections from these output pins to the PCB will solve the need for an increased current path. But at the same time, the additional copper inhibits the flow of solder due to the heat wicking effect of the increased copper area during the assembly process which will cause the upper layers of the PCB to have no connection at all to the output pins of the module.

FIG. 1 illustrates a PCB 100 having a power connection structure receiving a pin of a power supply module (not shown) according to a prior art. The PCB 100 has a top layer 102, several intermediate layers 104, and a bottom layer 106. FIG. 1 illustrates a PCB having four intermediate layers. A plated through hole 108 disposed through all layers 102, 104, and 106 mate with the pin of the power supply module.

FIG. 2 illustrates a cross-sectional view of a PCB 200 receiving a pin 202 of a power supply module 204 according to a prior art. A plated through hole 206 received the pin 202. Solder 208 connects the pin 202 to the plating 210 of the plated through hole 206. The pin 202 is coupled to the PCB 200 through solder 208 and the plating 210. However during reflow process, the thermal mass from all the inner layers 212 draws heat from solder 208 and prevents solder 208 from reaching the top layer 214 of the PCB 200.

Therefore, a solder fill may at most reach the second or third layer, rendering the connection inefficient and potentially faulty. It would be desirable to provide a power connection structure for a PCB capable of carrying high current outputs while preventing a heat wicking effect of the copper area due to high current, thereby saving costs and board space.

BRIEF DESCRIPTION OF THE INVENTION

A multi-layer printed circuit board (PCB) has a plated through hole for receiving a pin of a component. The plated through hole passes through all layers of the PCB and includes a first conductive portion on a first surface of the PCB and a second conductive portion on a second surface of the PCB. At least one layer of the PCB includes a planar conductive material disposed over a planar insulating material. The conductive material surrounds the plated through hole and is separated therefrom by a gap.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a power connection structure. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
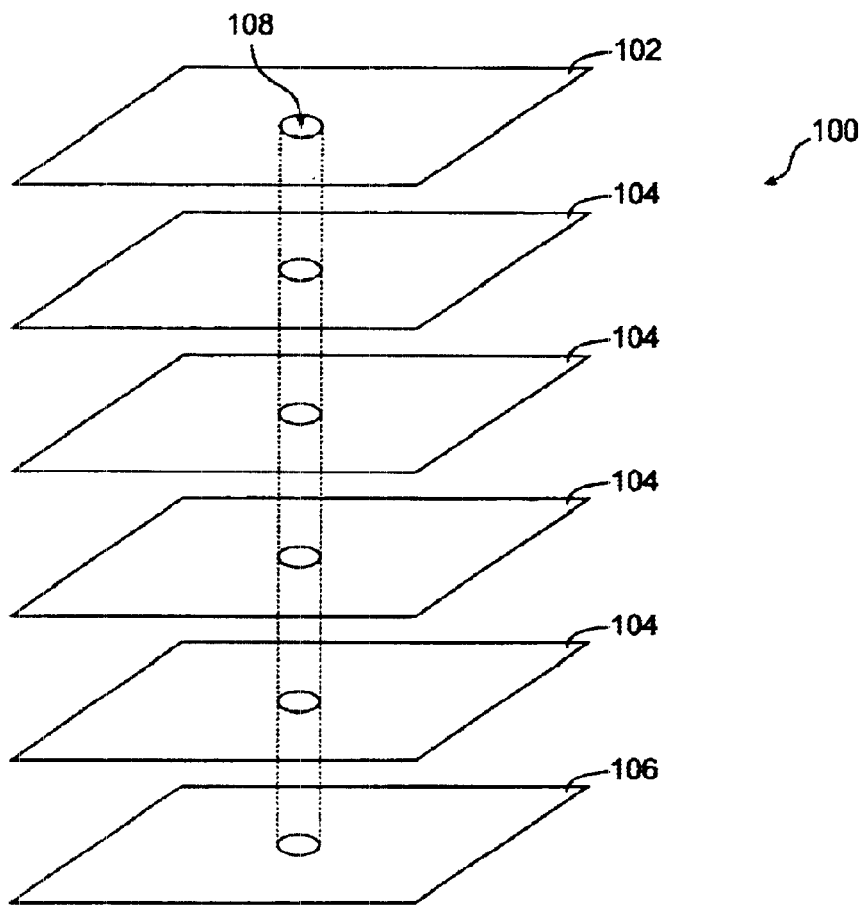
FIG. 1 is a perspective schematic diagram of a printed circuit board (PCB) arrangement for receiving a pin of a power supply module according to a prior art.
Figure 2:
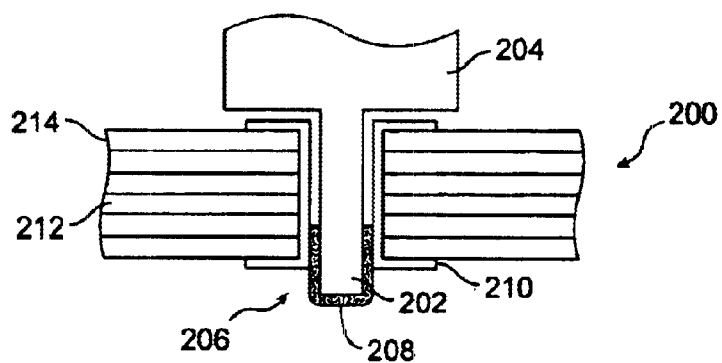
FIG. 2 is a schematic cross-section of a PCB arrangement for receiving a pin of a power supply module according to a prior art.
Figure 3:
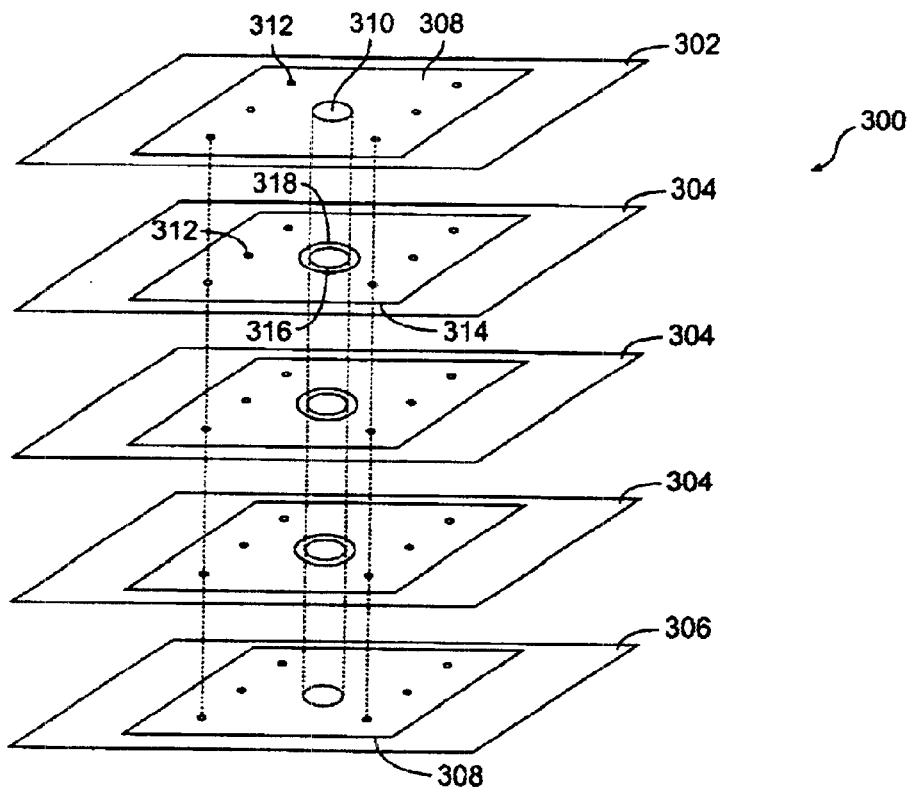
FIG. 3 is a schematic diagram illustrating a PCB arrangement for receiving a pin of a component according to one embodiment of the present invention.

FIG. 3 is a schematic diagram illustrating a printed circuit board (PCB) 300 having a power connection structure for receiving a pin of a component according to one embodiment of the present invention. The PCB 300 has a top layer 302, at least one inner layers 304, and a bottom layer 306. Both top and bottom layers 302 and 306 each include a pad 308. The pad 308 may include a planar conductive material, such as copper. A plated through hole 310 passes through all layers of the PCB 300. The plated through hole 310 also includes a conductive portion on the top layer 302 and on the bottom layer 304. The plated through hole 310 receives a pin (not shown) of a component, such as a power supply module. The pad 308 may also include vias 312 placed adjacent to the plated through hole 310, connecting all layers of the PCB 302, 304, and 306. The vias 412 provide enough connection to all the layers of the PCB 300 to handle a current flowing through the pin.

Each inner layer 404 of the PCB 300 also includes a pad 314. The pad 314 includes a plated through hole 316 corresponding with the plated through holes 310 of the top layer 302 and the bottom layer 306 of the PCB 300. Thus, both plated through hole 310 and 316 have the same diameter and the same axis. The pad 314 also includes a planar conductive material, such as copper, disposed over a planar insulating material (not shown), such as fiberglass. The conductive material of the pad 314 surrounds the plated through hole 316 of the inner layer 304 of the PCB 300 and is separated therefrom by a gap 318. According to one embodiment, the diameter of the gap 318 is at least 10 mils above the diameter of the plated through hole 316. The gap 318 may also be in the shape of a ring having an inner radius and an outer radius, with an inner radius of at least 1.4 times a radius of the plated through hole 316. The gap 318 may also be in the shape of a square or any other shape preventing the planar conductive material of the pad 314 from directly contacting the plated through hole 316. Furthermore, the plated through hole 316 may take any shape for receiving the pin. For example, if the pin is in a round shape, the plated through holes 310 and 316 will also be in a round shape as well. If the pin is in the shape of a square, the plated through holes 310 and 316 will be in the shape of a square as well.

Therefore, each plated through hole 316 of each inner layer 304 is electrically isolated from the remaining surface of the pad 314 such that no electrical current can flow from a pin (not shown) coupled with the plated through hole 316 through the pad 314 to the vias 312, and vice-versa. This provides a reduced thermal profile to ensure solder flow during an assembly process of a module coupling with the PCB 300. According to one embodiment, the electrical isolation may be implemented by disposing a non-conductive material in the gap 318 around each plated through hole 316 of each inner layer 304 of the PCB 300.

Therefore, according to one embodiment of the present invention, a current flows from a pin coupled with the aligned plated through holes 310 and 316 through the pad 308 of the top layer 302 down through the vias 312 to bottom layer 306 of the PCB. The electrical current flowing through the pads 314 of the inner layers 304 from the vias 312 does not directly contact the plated through hole 316 of each inner layers 304. The vias may be disposed on each layer at least 9 mils from an outer edge of the gap 318.

According to another embodiment, a circuit board has a top layer and several inner layers according to the above descriptions. According to another embodiment, a circuit board has several inner layers and a bottom layer according to the above descriptions.

Figure 4A:
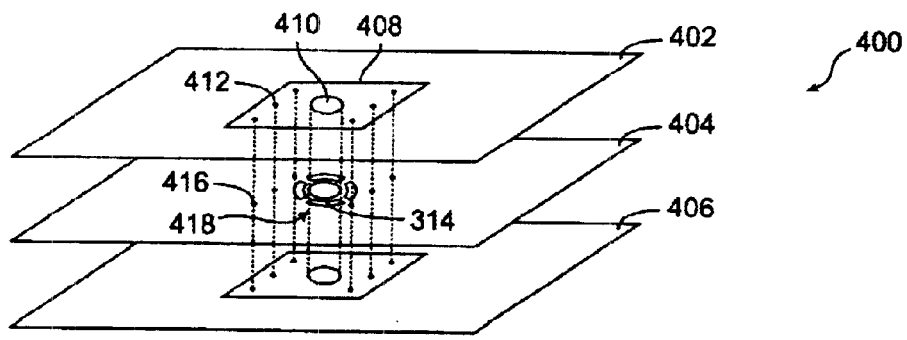
FIG. 4 is a schematic diagram illustrating a PCB arrangement for receiving a pin of a component according to another embodiment of the present invention.

FIG. 4A is a schematic diagram illustrating a printed circuit board (PCB) 400 having a power connection structure for receiving a pin of a component according to another embodiment of the present invention. The PCB 400 has a top layer 402, at least one inner layer 404, and a bottom layer 406. The top layer 402 includes an electrically conductive pad 408. According to one embodiment, the electrically conductive pad 308 comprises copper and includes a plated through hole 410 for receiving the pin of a power supply module (not shown). Vias 412 are disposed in the pad 408 to connect all the layers 402, 404, and 406 of the PCB 400. Therefore, a pin disposed and soldered in the plated through hole 410 may generate a current flowing through the pad 410 down through the electrically conductive vias 412 down through the inner layer 404 and finally to the bottom layer 406. Those of ordinary skill in the art will recognize that vias may include any electrically conductive material, such as copper or gold.

The size of the plated through hole 410 is based on the size of the pin coupled to the PCB 400. According to one embodiment of the present invention, the diameter of the plated through hole 410 is about 1.6 times the diameter of the pin. The diameter of the plated through hole 410 may also be based on a standard drill size that accounts for some variance in a standard library.

In addition, the size of the pad 408 may also be based on the size of the plated through hole 410. According to one embodiment, the area of the pad 408 may be between 150% and 170% of the size of the plated through hole 410 with a pad diameter of at least 12 mils.

Figure 4B:
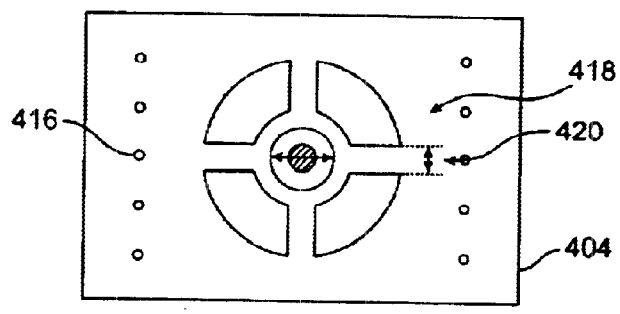

The inner layer 404 includes a plated through hole 414 and vias 416 corresponding with the plated through hole 410 and the vias 412 from the top layer 402. The inner layer 404 also includes a thermal relief structure 418 disposed around the plated through hole 414. FIG. 4B illustrates a schematic top view of the thermal relief structure 418 disposed on the inner layer 404. The thermal relief structure 418 may be a thermal resistive coupling having a number of spokes or bridges connecting the plated through hole 414 to the rest of the conductive material disposed on the inner layer 404. FIG. 4B illustrates a thermal resistive coupling having four spokes. The width of a spoke 420 is calculated to insure that no more than 10 degree Celsius rise will occur on the internal layer 404. This is the point of delivery calculated through which all power from the pin of a power module must flow.

To derive a standard method for calculating the geometry of the thermal relief structure, the method takes into account temperature rise during heaving load conditions and manufacturing considerations for adequate solder flow during standard assembly process. All data found which applies calculations to rise in temperature in conductors on boards have been derived from empirical data. This includes charts (not shown) showing Current in Amps v. Conductor cross-section in square inches for different copper foil layer thickness. The following formula describes the relationship between the current, conductor area, and change in temperature:

$$I=0.0150\ (\Delta T^{0.5453})(A^{0.7349}) \qquad \text{Equation 1}$$

wherein I represents the current in Amps, $\Delta T$ represents the change in temperature in degree Celsius, and A represents in the surface of a cross-section of a conductor. Since Equation 1 is used for individual traces, it does not apply directly to the rise in temperature of a spoke on a thermal relief connection due to the fact that the pin of a module to which it is connected acts as a heat sink; the area of copper on the power or ground plane to which it is connected also acts as a heat sink increasing the current handling capability. Thus, the calculation used to find a width of a spoke with specific maximum current flow and heat sink effect is represented as a multiplier constant.

For example, the multiplier constant based on the following device: a power module that provides 20A with a 60 mil output pin using a 50 mil spoke, may have a multiplier of 185%. Thus, using the multiplier, the current capacity is increased by 1.85 times. The width of the spoke is then calculated using Equation 1 to insure that no more than, for example, 10 degree Celsius rise occurs on the inner layer 404 of the PCB 400. The current flowing from the pin of the module thus travels through the inner layer 404 of the PCB 400. The limitation of a potential rise in temperature of the inner layer 404 of the PCB 400 prevents the electrical connections from melting and breaking up while allowing a high current to reliably flow through the inner layer 404 of the PCB 400.

Figure 5:
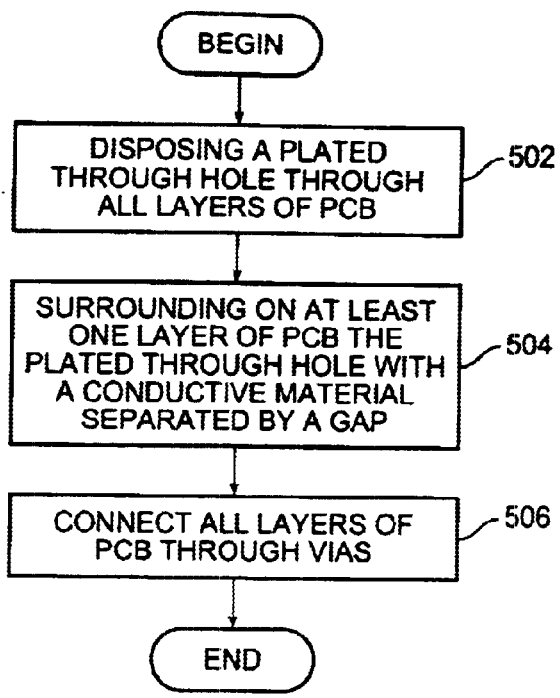
FIG. 5 is a flow diagram illustrating a method for connecting a pin of a component to a PCB according to one embodiment of the present invention.

FIG. 5 is a flow diagram 500 illustrating a method for connecting a pin of a component, such as a power supply module, to a PCB according to one embodiment of the present invention. In a first block 502, a plated through hole for receiving the pin of the component is disposed through all layers of the PCB. The plated through hole includes a first conductive portion on a first surface, such as the top layer of the PCB, and a second conductive portion on a second surface, such as the bottom layer of the PCB.

In a block 504, the plated through hole, on at least one layer of the PCB including a planar conductive material disposed over a planar insulating material, is surrounded with a conductive material separated therefrom by a gap. According to one embodiment, the inner layers of the PCB have a gap surrounding the plated through hole for preventing current from flowing directly between a pin coupled through the plated through hole and to remaining conductive material surface of the inner layers.

In block 506, according one embodiment, each layer may electrically be connected through vias disposed adjacent to the plated through hole outside of the gap on each layer of the PCB. The vias may be disposed at least 9 mils from an outer edge of said gap. The vias provide enough connection to all the layers of the PCB to handle the total current flow. So when a pin is soldered to the plated through hole, the solder can reach the entire length of the pin since no heat is being dissipated through the internal layers of the PCB. The heat cannot be dissipated because of the gap surround the plated through hole of the inner layers of the PCB.

Figure 6:
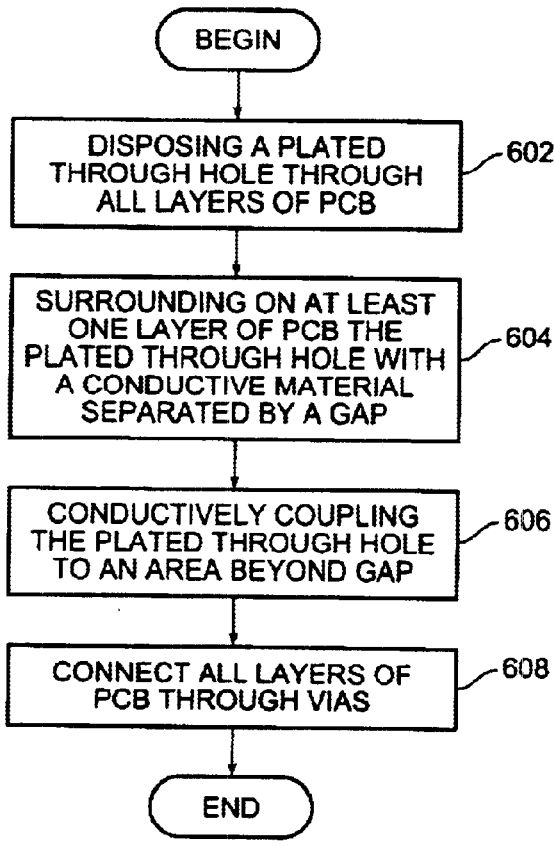
FIG. 6 is a flow diagram illustrating a method for connecting a pin of a component to a PCB according to another embodiment of the present invention.

FIG. 6 is a flow diagram illustrating a method for connecting a pin of a component, such as a power supply module, to a PCB according to another embodiment of the present invention. In a first block 602, a plated through hole for receiving the pin of the component is disposed through all layers of the PCB. The plated through hole includes a first conductive portion on a first surface, such as the top layer of the PCB, and a second conductive portion on a second surface, such as the bottom layer of the PCB. The diameter of the plated through hole is adjusted based on the diameter of the pin of the module. According to one embodiment, the diameter of the plated through hole is 1.6 times the diameter of the pin of the module. Such adjustment allows solder to flow efficiently through all layers of the PCB in the plated through hole with a pin inserted therein.

In a block 604, the plated through hole, on at least one layer of the PCB which includes a planar conductive material disposed over a planar insulating material, is surrounded with a conductive material separated therefrom by a gap. According to one embodiment, the inner layers of the PCB have a gap surrounding the plated through hole for preventing current from flowing directly between a pin coupled through the plated through hole and to remaining conductive material surface of the inner layers.

In a block 606, on the inner layers, the plated through hole is conductively coupled to an area of the planar conductive material beyond the gap with a number of bridging conductors formed out of the planar conductive material. The bridging conductors, for example spokes or traces, have a cross-sectional area limiting a predetermined temperature increase of the bridging conductors acting as a restricted flow path. The bridging conductors act as a thermal relief structure, or thermal resistance. According to one embodiment, the width of the spoke is adjusted so that the heat flowing through the spoke is limited to a maximum temperature. The width of the spoke controls the flow of current and therefore the rise in temperature of the inner layer. The width of the spoke is calculated such that the rise of temperature of the inner layer is limited to prevent any damage to the inner layer. According to one embodiment of the present invention, the rise in temperature through a spoke should be no more than 10 to 15 degrees Celsius.

In block 608, according one embodiment, each layer is also electrically be connected through vias disposed adjacent to the plated through hole outside of the gap on each layer of the PCB. The vias may be disposed at least 9 mils from an outer edge of said gap. So, when a pin is soldered to the plated through hole, the solder can reach the entire length of the pin since limited amount of heat is being dissipated through the internal layers of the PCB. The heat dissipation is limited because of the gap and the thermal resistance structure surrounding the plated through hole of the inner layers of the PCB.

The power connection structure discussed above saves cost by avoiding additional soldering processes due to the increased thermal profile. Incorporating the solution into a pad shape standardizes the shape and geometry so that the layout engineers do not have to repeat or re-design work to build a solution during the layout process. Incorporating the solution into the shape also insures that the need for increased current and reduced thermal profile is applied every time and is not forgotten so that boards do not fail out in the field.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A multi-layer printed circuit board (PCB) comprising:
   a first layer;
   a second layer;
   at least one intermediate layer provided between the first layer and the second layer, the intermediate layer including a planner conductive material; and
   a plated through hole for receiving a pin of a component, the plated through hole including:
      a hole passing through all layers of the PCB; and
      a plated layer provided on a wall of the hole, the plated layer including a first conductive portion on a first surface of the first layer and a second conductive portion on a second surface of the second layer,
   wherein the planar conductive material includes a gap surrounding the plated through hole and separating the remaining planar conductive material therefrom.

2. The multi-layer PCB according to claim 1 wherein said gap is placed at least 5 mils from an edge of said plated through hole.

3. The multi-layer PCB according to claim 1 wherein said gap is in the shape of a ring having an inner radius and an outer radius.

4. The multi-layer PCB according to claim 3 wherein said inner radius is at least 1.4 times a radius of said plated through hole.

5. The multi-layer PCB according to claim 1 wherein said gap has a shape in accordance with a shape of the pin.

6. The multi-layer PCB according to claim 1, further comprising:
   at least one via disposed through said planar conductive material, the via electrically connecting the planar conductive material to the first and second layers.

7. The multi-layer PCB according to claim 6 wherein said via is placed at least 9 mils from an outer edge of said gap.

8. The multi-layer PCB according to claim 1, comprising a plurality of intermediate layers having a planar conductive material, the planar conductive material including a gap that surrounds the plated through hole and separates the remaining planar conductive material therefrom.

9. The multi-layer PCB according to claim 1, further comprising:
  a plurality of bridging conductors formed across the gap of a planar conductive material of an intermediate layer, the bridging conductors conductively and thermal-resistively coupling the plated through hole to an area of the planar conductive material beyond the gap.

10. The multi-layer PCB according to claim 9 wherein said bridging conductors thermal-resistively couple the planar conductive material to the plated through hole.

11. The multi-layer PCB according to claim 10 wherein said bridging conductors limits temperature increase in the intermediate layer to about 10 degrees Celsius or less.

12. The multi-layer PCB according to claim 9, further comprising:
  at least one via disposed through said planar conductive material, the via electrically connecting the planar conductive material to the first and second layers.

13. The multi-layer PCB according to claim 12 wherein said via is placed at least 9 mils from an outer edge of said gap.

14. A method for connecting a pin of a component to a multi-layer printed circuit board (PCB), the PCB including a first layer, a second layer, and at least one intermediate layer provided between the first layer and the second layer, the intermediate layer including a planar conductive layer, the method comprising:
  disposing a plated through hole for receiving the pin of the component, said disposing including:
    providing a hole passing through all layers of the PCB and the planar conductive material;
    plating the hole to provide a plated layer thereon, said plated layer including a first conductive portion on the first surface and a second conductive portion on the second surface; and
  providing a gap in the planar conductive material such that a gap surrounds said plated through hole and separates the remaining planar conductive material therefrom.

15. The method according to claim 14 further comprising:
  disposing at least one via passing through said conductive planar material so as to electrically connect the planar conductive material to the first and second layers.

16. The method according to claim 15 wherein said via is placed at least 9 mils from an outer edge of said gap.

17. The method according to claim 14 further comprising:
  conductively coupling the plated through hole to an area of the planar conductive material across the gap with a plurality of bridging conductors.

18. The method according to claim 17 wherein said bridging conductors also thermal-resistively couple the planar conductive material to the plated through hole.

19. The method according to claim 18 wherein said bridging conductors limits temperature increase in the intermediate layer to about 10 degrees Celsius or less.

20. A method for providing a power connection to a multi-layer printed circuit board (PCB), the PCB including a first layer, a second layer, at least one intermediate layer provided between the first layer and a second layer, and a plated through hole for receiving a pin of a component, the intermediate layer including a planar conductive material, the plated through hole passing through the all layers of the PCB, said method comprising:
  electrically connecting the first layer to the second layer through the plated through hole;
  isolating the planar conductive material on the intermediate layer from the plated through hole; and
  electrically connecting the first layer, the planar conductive material of the intermediate layer, and the second layer by at least one via disposed through the all layers of the PCB.

21. The method according to claim 20 wherein said isolating includes:
  providing a gap surrounding the through hole so as to separate the remaining planar conductive material from the through hole.

22. The method according to claim 21, further comprising:
  electrically and thermal-resistively coupling the plated through hole to the planar conductive material of the intermediate layer beyond the gap.

23. An apparatus for providing a power connection to a multi-layer printed circuit board (PCB), the PCB including a first layer, a second layer, at least one intermediate layer provided between the first layer and a second layer, a planar conductive material disposed on each layer, and a through hole for receiving a pin of a component, the through hole passing through the all layers of the PCB and the planar conductive material thereon, said apparatus comprising:
  first means for electrically connecting the first layer to the second layer through the plated through hole;
  means for isolating the planar conductive material on the intermediate layer from the plated through hole; and
  second means for electrically connecting the first layer, the planar conductive material of the intermediate layer, and the second layer.

24. The apparatus according to claim 23 wherein said first means for electrically connecting includes:
  a plate layer formed on a wall of the through hole.

25. The apparatus according to claim 24 wherein said first means for electrically connecting further includes:
  a first conductive portion formed on the first layer; and
  a second conductive portion formed on the second layer.

26. The apparatus according to claim 23 wherein said means for isolating includes:
  a gap surrounding the through hole so as to separate the remaining planar conductive material from the through hole.

27. The apparatus according to claim 26 wherein said means for isolating further includes:
  means for electrically and thermal-resistively coupling the through hole to the planar conductive material of the intermediate layer.

28. The apparatus according to claim 27 wherein said means for electrically and thermal-resistively coupling includes:
  a plurality of bridging conductors formed across the gap.

29. The apparatus according to claim 28 wherein a cross-sectional area of the plurality of bridging conductors is determined so as to provide a desirable thermal-resistance.

30. The apparatus according to claim 23 wherein said second means for electrically connecting includes:
  at least one via disposed through the all layers of the PCB.

* * * * *